(12) United States Patent
Eisert et al.

(10) Patent No.: US 7,205,578 B2
(45) Date of Patent: Apr. 17, 2007

(54) SEMICONDUCTOR COMPONENT WHICH EMITS RADIATION, AND METHOD FOR PRODUCING THE SAME

(75) Inventors: Dominik Eisert, Regensburg (DE); Volker Härle, Laaber (DE); Frank Kühn, München (DE); Manfred Mundbrod-Vangerow, Oxenbronn (DE); Uwe Strauss, Bad Abbach (DE); Jacob Ulrich, Regensburg (DE); Ernst Nirschl, Wenzenbach (DE); Norbert Linder, Wenzenbach (DE); Reinhard Sedlmeier, Neutraubling (DE); Ulrich Zehnder, Regensburg (DE); Johannes Baur, Deuerling (DE)

(73) Assignee: Osram GmbH (DE)

( * ) Notice: Subject to any disclaimer, the term of this patent is extended or adjusted under 35 U.S.C. 154(b) by 0 days.

(21) Appl. No.: 10/203,728

(22) PCT Filed: Feb. 15, 2001

(86) PCT No.: PCT/DE01/00600

§ 371 (c)(1),
(2), (4) Date: Dec. 2, 2002

(87) PCT Pub. No.: WO01/61765

PCT Pub. Date: Aug. 23, 2001

(65) Prior Publication Data

US 2003/0127654 A1    Jul. 10, 2003

(30) Foreign Application Priority Data

Feb. 15, 2000 (DE) .............................. 100 06 738
May 23, 2000 (DE) .............................. 100 25 448

(51) Int. Cl.
*H01L 33/00* (2006.01)

(52) U.S. Cl. ...................... 257/98; 257/91; 257/99; 257/103

(58) Field of Classification Search ................ 257/78, 257/91, 94–100, 103
See application file for complete search history.

(56) References Cited

U.S. PATENT DOCUMENTS 3,202,543 A    8/1965  Thun et al. ................. 117/210

(Continued)

FOREIGN PATENT DOCUMENTS

CN    1224533    7/1997

(Continued)

OTHER PUBLICATIONS

Lee, S.J. et al.: "Efficiency Improvement in Light-Emitting Diodes Based on Geometrically Deformed Chips", SPIE Conference on Light-Emitting Diodes, San Jose, CA, Jan. 1999, S. 237-248.

(Continued)

*Primary Examiner*—Ori Nadav
(74) *Attorney, Agent, or Firm*—Fish & Richardson P.C.

(57) ABSTRACT

This invention describes a radiation-emitting semiconductor component with the a multilayered structure (4) that contains a radiation-emitting active layer (5), and a window (1) transparent to radiation that has a first principal face (2) and a second principal face (3) opposite the first principal face (2), and whose first principal face (2) adjoins the multilayered structure (4).

At least one recess (8) is made in the window (1), which preferably has the form of an indentation of the second principal face or as an edge excavation. At least one lateral surface of the window (1) or of the recess (8) is provided at least partially with a contact surface (11). Alternatively or cumulatively, at least one contact surface of the component has a plurality of openings (14).

29 Claims, 8 Drawing Sheets

U.S. PATENT DOCUMENTS

| | | | |
|---|---|---|---|
| 4,459,100 A | 7/1984 | de la Burde et al. | 131/296 |
| 4,965,223 A | 10/1990 | Steranka | |
| 5,087,949 A * | 2/1992 | Haitz | 257/79 |
| 5,233,204 A | 8/1993 | Fletcher et al. | 257/13 |
| 5,309,001 A | 5/1994 | Watanabe et al. | 257/99 |
| 5,349,211 A | 9/1994 | Kato | 257/90 |
| 5,387,804 A | 2/1995 | Suzuki et al. | 257/77 |
| 5,547,906 A | 8/1996 | Badehi | 438/109 |
| 5,563,422 A | 10/1996 | Nakamura et al. | |
| 5,585,648 A | 12/1996 | Tischler | |
| 5,744,828 A | 4/1998 | Nozaki et al. | 257/94 |
| 5,753,940 A | 5/1998 | Komoto | 257/95 |
| 5,753,966 A | 5/1998 | Morita et al. | 257/627 |
| 5,767,581 A | 6/1998 | Nakamura et al. | 257/749 |
| 5,779,924 A | 7/1998 | Krames et al. | |
| 5,821,568 A | 10/1998 | Morita et al. | 257/94 |
| 5,864,171 A | 1/1999 | Yamamoto et al. | |
| 5,998,232 A * | 12/1999 | Maruska | 438/46 |
| 6,040,235 A | 3/2000 | Badehi | 438/464 |
| 6,117,707 A | 9/2000 | Badehi | 438/113 |
| 6,143,588 A | 11/2000 | Glenn | 438/116 |
| 6,168,965 B1 | 1/2001 | Malinovich et al. | 438/66 |
| 6,194,743 B1 | 2/2001 | Kondoh et al. | 257/94 |
| 6,229,160 B1 | 5/2001 | Krames et al. | 257/94 |
| 6,291,839 B1 | 9/2001 | Lester | 257/91 |
| 6,329,224 B1 | 12/2001 | Nguyen et al. | 438/127 |
| 6,429,462 B1 * | 8/2002 | Shveykin | 257/95 |
| 6,459,100 B1 * | 10/2002 | Doverspike et al. | 257/97 |
| 6,630,780 B1 | 10/2003 | Yan | 313/493 |

FOREIGN PATENT DOCUMENTS

| | | |
|---|---|---|
| CN | 1158017 A | 8/1997 |
| DE | 24 16 098 | 10/1975 |
| DE | 26 26 564 | 12/1976 |
| DE | 254322 | 3/1977 |
| DE | 28 13 930 | 10/1979 |
| DE | 41 30 878 | 3/1993 |
| DE | 43 05 296 | 8/1994 |
| DE | 44 27 840 | 2/1996 |
| DE | 195 36438 | 4/1997 |
| DE | 198 07758 | 12/1998 |
| DE | 19927945 | 3/2000 |
| EP | JP 59-004088 | 1/1982 |
| EP | 0083510 | 7/1983 |
| EP | JP 61-110476 | 5/1986 |
| EP | JP 61-296780 | 12/1986 |
| EP | 405 757 | 1/1991 |
| EP | JP 03-227078 | 10/1991 |
| EP | JP 03-283675 | 12/1991 |
| EP | 0544408 | 6/1993 |
| EP | 0 562 880 | 9/1993 |
| EP | JP 05-327012 | 12/1993 |
| EP | JP 06-310752 | 11/1994 |
| EP | JP 07-086635 | 3/1995 |
| EP | 0 650 202 | 4/1995 |
| EP | JP 08-102549 | 4/1996 |
| EP | 0 779 667 | 6/1997 |
| EP | JP 10-256602 | 9/1998 |
| EP | 0977277 | 2/2000 |
| JP | 53-61986 | 11/1976 |
| JP | 401099266 * | 4/1989 |
| JP | 094137771 | 5/1992 |
| JP | 04-164376 | 6/1992 |
| JP | 4-164376 | 10/1992 |
| JP | 06237012 | 8/1994 |
| JP | 08102549 * | 4/1996 |
| JP | 09-036431 | 2/1997 |
| JP | 10-326910 | 8/1998 |
| JP | 10-341035 | 12/1998 |
| WO | WO 98/07195 | 2/1998 |

OTHER PUBLICATIONS

Deckman H.W., et al., "Natural lithography", *Appl. Phys. Lett.* 41(4), Aug. 15, 1982, pp. 377-379.

Deckham H.W., et al., "Applications of surface textures produced with natural lithography", *J. Vac. Sci. Technol.* B. 1(4), Oct.-Dec. 1973, pp. 1109-1112.

Schnitzer, I. and Yablonovitch, E., "30% External Quantum Efficiency from Surface Textured, Thin-Film Light Emitting Diodes", *Appl. Phys. Lett.*, vol. 63, No. 16, pp. 2174-2176; 1993.

Patent Abstract of JP 09036431, Feb. 7, 1997, Japan.

Molnar et al., "Blue-violet light emitting gallium nitride *p-n* junctions grown by electron cyclotron resonance-assisted molecular beam epitaxy", *Appl. Phys. Lett.* 66 (3), Jan. 16, 1995, pp. 268-270.

Yablonovitch et al., "Van der Waals bonding of GaAs epitaxial liftoff films onto arbitrary substrates", *Appl. Phys. Lett.* 56 (24), Jun. 11, 1990, pp. 2419-2421.

Sheu et al., "High transparency Ni/Au ohmic contact to *p*-type GaN", *Appl. Phys. Lett*, 74 (16), 1999, pp. 2340-2342.

* cited by examiner

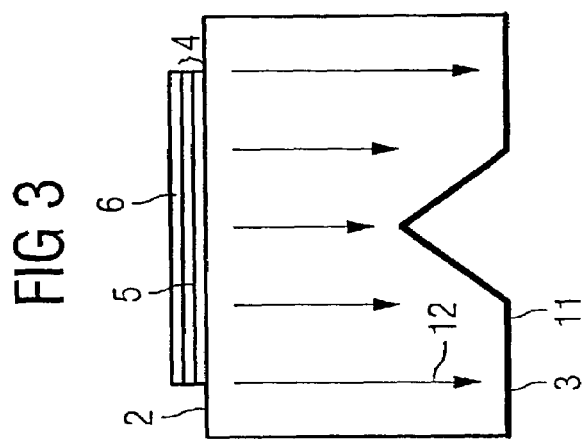
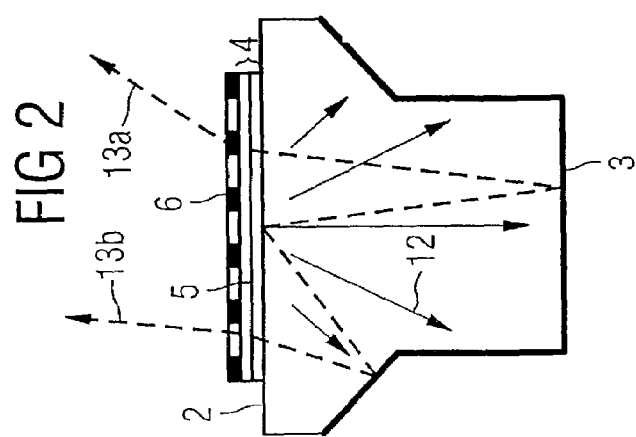
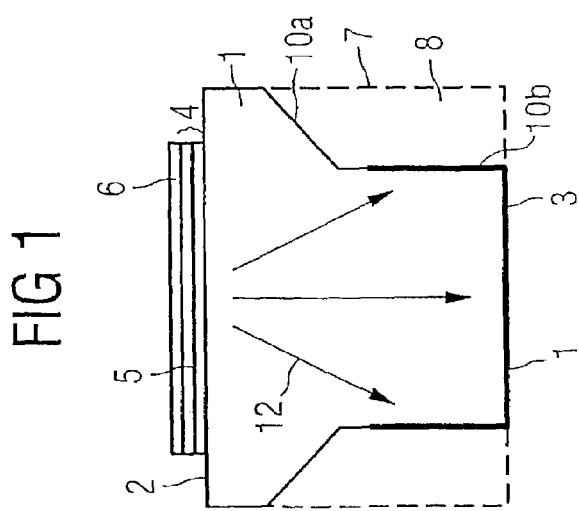

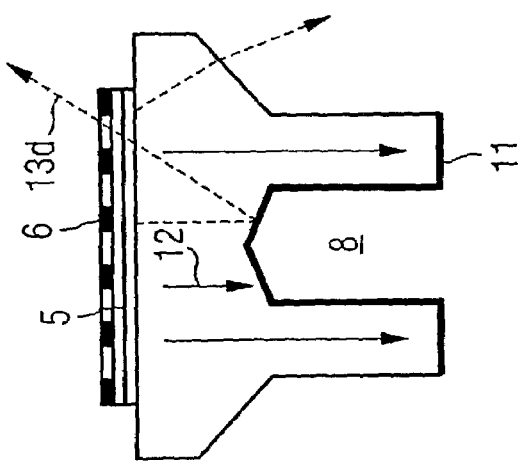
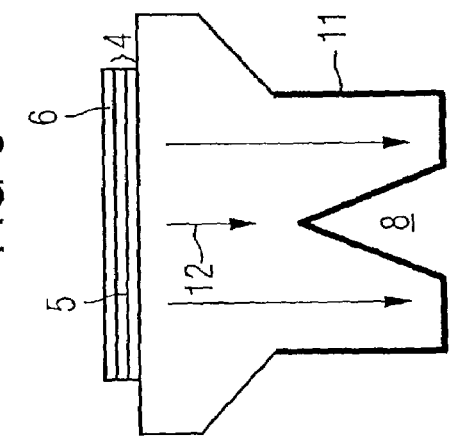
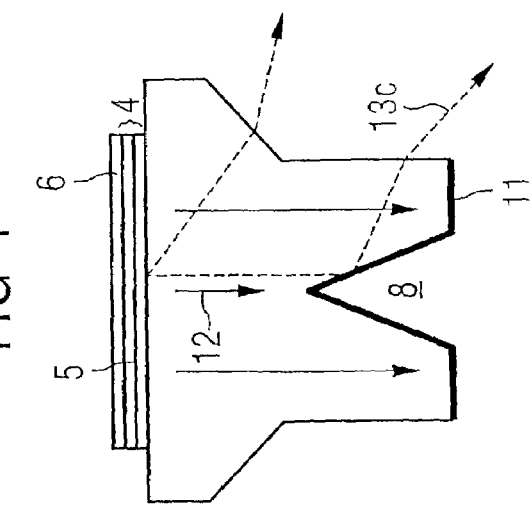

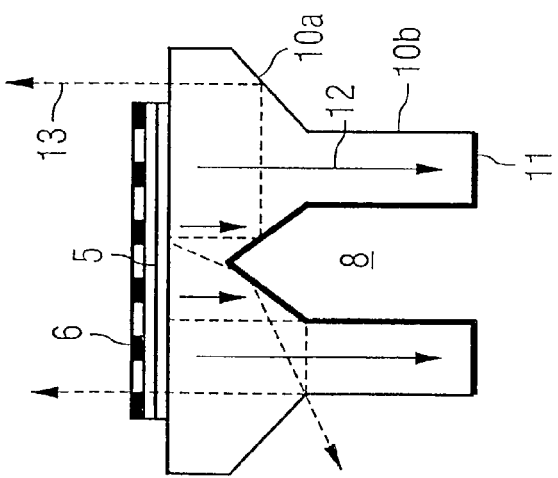
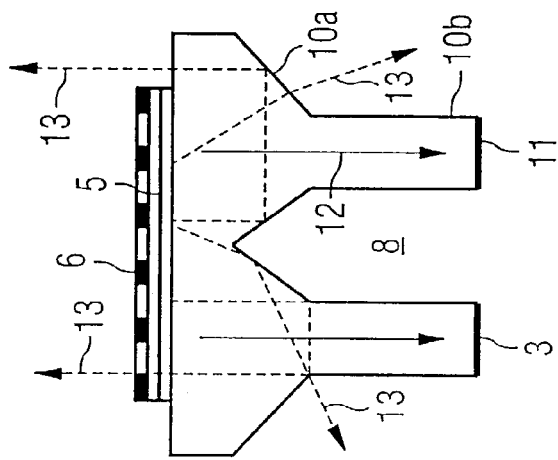
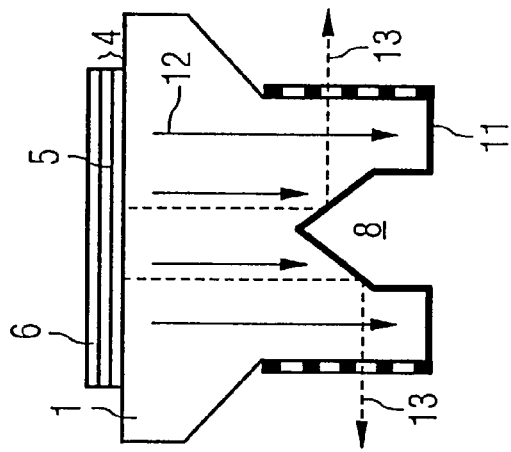

SEMICONDUCTOR COMPONENT WHICH EMITS RADIATION, AND METHOD FOR PRODUCING THE SAME

BACKGROUND OF THE INVENTION

This invention relates to a radiation-emitting semiconductor component.

The invention relates in particular to a radiation-emitting semiconductor component with a nitride-based active multilayered structure applied to a silicon carbide-based epitaxial substrate.

Radiation-emitting semiconductor components of the kind mentioned usually have a semiconductor multilayered structure with an active radiation-generating layer that is applied to a carrier transparent to radiation. The radiation is output through the carrier. In this arrangement, however, the radiation yield is sharply reduced by total reflection of the produced radiation at the carrier surface.

With block-shaped or cuboid carriers the fraction of totally reflected radiation that cannot be output is especially high because of the orthogonal arrangement of lateral faces and principal faces of the carrier. The radiation yield can be increased by forming recesses in the carrier whose lateral faces are preferably inclined relative to the principal faces of the carrier.

A form such as that specified in the priority-determining Patent Application DE 100 067 38.7 is especially beneficial. The contents of this Patent Application are explicitly incorporated in the contents of the present Patent Application.

A corresponding component is shown schematically in FIG. 17. The semiconductor component shown has a window 151 transparent to radiation, to which is applied a radiation-producing multilayered structure 152. At least one lateral face of the window 151 is configured so that a first subregion 154 is inclined, concave, or stepped relative to the normal to the multilayered structure 152, which is adjoined by a second region 155 positioned parallel to the normal to the multilayered structure. There are also two contact surfaces 153a, b on the multilayered structure 152 on the one hand and on the face of the semiconductor component facing away from the multilayered structure 152 on the other hand.

SUMMARY OF THE INVENTION

It is the purpose of this invention to provide a radiation-emitting semiconductor component with improved efficiency. It is also the purpose of the invention to develop a method for manufacturing it. Finally, it is a purpose of the invention to develop a corresponding optical component.

The invention proceeds from the assumption that the ratio of output radiation power to the electrical power to be supplied for it is critical for the degree of efficiency. The optical output power depends on the degree of output, along with the current flowing through the component. The degree of output indicates how large is the fraction of output radiation relative to the total radiation produced. The electrical power is determined by the current flowing and the series resistance of the component. The degree of efficiency can therefore be increased in particular by lowering the series resistance and by increasing the degree of output.

According to the invention, a first form of embodiment provides for forming a radiation-emitting semiconductor component with a multilayered structure, an active layer that generates radiation within the multilayered structure, and a window transparent to radiation with a first principal face and a second principal face opposite the first principal face, with at least one recess being formed in the window to constitute inclined radiation output faces, and at least one lateral surface of the window and/or of the recess being provided with a contact surface. The contact surface preferably also extends over the second principal face of the window or subregions thereof.

The current path from the contact surface to the active layer is shortened on the average by this arrangement of the contact surface, and thus beneficially reduces the series resistance of the component.

The recess in the invention serves to increase the radiation yield. Either direct output or reflection in a direction favoring output is produced in particular by lateral faces that are inclined relative to the principal faces of the window. A recess in the window means both an indentation in the second principal face of the window or removal of material from an edge of the window, as shown for example in FIG. 15. When material is removed from the edge, the lateral surfaces of the window and of the recess partially coincide.

A second contact surface on the multilayered structure is preferably provided for in the invention. This provides for current being fed in close to the active layer within the multilayered structure. It is especially advantageous for this contact surface to be largely transparent to radiation, so that radiation output is also possible through the second contact surface. This can be achieved, for example, by appropriately thin metallization or suitable transparent, electrically conductive films.

In a preferred refinement of the invention, the first contact surface is a reflector. Because of this, the portions of the radiation that strike the contact surface from inside the window are not absorbed, but are reflected back, so that subsequent output is possible. Thus a contact surface that is transparent to radiation and one that is reflective contribute to increasing the radiation yield, since they assist the output of radiation either directly or indirectly.

A second embodiment of the invention provides forming a radiation-emitting semiconductor component with a multilayered structure, an active layer within the multilayered structure serving to generate radiation, and a window transparent to radiation, with a first principal face and a second principal face opposite the first principal face, with at least one recess being formed in the window to form an inclined radiation output surface. The component here has at least one contact surface with a plurality of openings.

It is preferred for at least one of the window surfaces to be provided, at least in part, with a first contact surface and for the multilayered structure to be provided, at least in part, with a second contact surface, with at least one of the contact surfaces having a plurality of openings.

It is advantageous also for a plurality of openings to be formed in each of the two contact surfaces.

These contact surfaces transparent to radiation, called perforated contact surfaces below, have the advantage over thin contact surfaces transparent to radiation, of higher long-term stability, particularly in a casting composition, for example such as epoxy resin. These perforated contact surfaces can also be made so that they have high transmission in the area of the openings and high reflection in the areas coated with contact material, so that absorption and therefore radiation loss is slight on these contact surfaces.

Perforated contact surfaces on the multilayered structure also have the advantage that they do not seal off the multilayered structure, so that for example gases such as hydrogen that reach the multilayered structure during manufacture can diffuse out of it. This also reduces the risk of such gases aggregating at the interface between the multilayered structure and the contact surface, passivating the contact surface, and thus increasing contact resistance and series resistance.

The openings in the contact surface(s) are preferably circular, square, rectangular, hexagonal, or in the shape of crossed slits. These forms are especially suitable for a regular arrangement and are comparatively easy to make technically. The openings are preferably packed tightly provided that the intermediate areas of the contact surfaces form a continuous network and the width of the areas meet the requirements for current input into the component. Of course the shapes mentioned do not constitute a limitation of the invention thereto.

In an advantageous configuration of the invention in both forms of embodiment, the recess is made in the form of an indentation in the second principal face of the window. It is beneficial that no change of the basic window enveloping shape is necessary, so that in particular production systems, which are often designed for a given basic window shape, can continue to be used without change. A plurality of indentations can also be made in the second principal face, whereby the radiation yield is further increased. This configuration is advantageous especially for large-area semiconductor components, since the ratio of area to circumference rises with increasing chip area, and thus more indentations can be placed in the surface than circumferentially.

In a preferred refinement of the invention, the indentation in the second principal face is designed with a triangular, trapezoidal, or semicircular cross section (section perpendicular to the second principal face). The cross section can also have the shape of a rectangle with added triangle, trapezoid, or semicircle. In general the formation of recesses with at least one lateral face not in an orthogonal position to the principal faces is advantageous.

Depending on the specific form of embodiment, the angle of incidence of the radiation produced relative to the normal to the lateral faces, and thus the fraction of totally reflected radiation, is thereby lowered, or reflection toward the flanks of the window is brought about, so that direct output or at least output after further reflections can take place. The latter applies in particular to the lateral faces of the indentation that are provided with a reflective contact surface.

The indentation in the second principal face of the window is preferably in the form of a trough with one of the aforementioned cross-sectional shapes. Such an indentation can be made, for example, by sawing into the window from the second principal face and using a saw blade with shaped rim. If this sawing is performed in the wafer composite, then a plurality of windows can advantageously be structured in one production step.

Alternatively, the indentations can also be etched in place. In this form of embodiment in particular, spatially isolated indentation shapes bordered all around can be formed. The structuring of a plurality of windows in the wafer composite in one production step is also advantageously possible here.

In an especially preferred refinement of the invention, the recess that increases radiation yield is formed at the edge of the second principal face and is so shaped that the window is tapered down toward the second principal face. It is preferred for the recess to be made so that the lateral faces of the recess have a first subregion inclined relative to the normal to the multilayered structure in the vicinity of the multilayered structure, that changes at greater distance from the multilayered structure to a second subregion running parallel to the normal to the multilayered structure.

The window is preferably formed as a parallelepiped in the section corresponding to the second region. It is advantageous that the radiation yield is increased by the inclined subregion, while the remaining area of the window has a square basic shape and thus can easily be mounted. In this case in particular, the lateral faces [of] the second subregion are provided with a contact surface. The contact surface can also extend over the first subregion of the lateral faces, and can then preferably be made reflective, so that the radiation yield toward the multilayered structure is increased by reflection of the radiation produced.

The described structure can be formed advantageously at low production cost, for example by sawing a wafer with a saw blade with shaped edge to isolate the semiconductor bodies, and then singling the semiconductor bodies by breaking the wafer. Prior sawing of the wafer is desirable to facilitate singling by breaking. The described window shape can be excavated at the same time by using a suitable saw blade with shaped edge. Other advantageous configurations in this regard are specified in DE 100 067 38.7, to which this invention refers in particular.

A manufacturing method pursuant to the invention begins with preparation of a window layer, from which the actual window will later be produced.

A semiconductor layer sequence corresponding to the multilayered structure is applied to the window layer. It is preferably applied epitaxially or in the context of a wafer-bonding procedure. In epitaxy, the window layer at the same time advantageously represents the epitaxy substrate. In a wafer-bonding procedure, the semiconductor layer sequence is produced first on a suitable substrate, and is then bonded to the window layer. Materials that are unsuitable for an epitaxial process can also advantageously be used here as window material.

In another step the window layer is structured to develop the recess in a suitable manner. Structuring can be accomplished, for example as described, by sawing or etching the window layer. Structuring can also be performed in multiple steps, not necessarily in succession. Thus, with regard to the mechanical breakage stability of the window layer, it is advantageous to first prestructure the window layer and to perform the final structuring only at a later stage of the production process.

In a further step the contact surfaces are applied to the window layer. The contact surfaces are preferably vapor-deposited or sputtered on for contact metallization.

Finally, the semiconductor components are completed. This includes in particular the singling of the composite of window layer and semiconductor layer sequence into a plurality of windows with multilayered structure located thereon. The singling is performed preferably by sawing and/or breaking the window layer. Additional contact surfaces, for example contact metallizations, can also be applied to the multilayered structure in the course of completion.

To perform the contact metallization, vapor deposition systems are ordinarily used, from which the metal vapor originates with a given preferential direction. It is advantageous in this case to arrange the surface of the window layer to be subjected to vapor deposition at an angle to this preferential direction. In this way, deposition of the metal vapor on the second principal face of the window layer and also on the lateral faces of the recesses formed by the structuring is achieved.

With regard to the sequence of the described manufacturing steps, three alternatives described below are distinguished by particular advantages:

In the first advantageous alternative, the semiconductor layer sequence is first applied to the window layer, the window layer is then structured, and finally it is subjected to vapor deposition to develop the contact surfaces. Especially in case of epitaxial production of the semiconductor layer sequence, existing production equipment can be used for this without changes, since with epitaxy the window layer does not yet differ from window layers pursuant to the state of the art. Furthermore, the window layer is structured only at the end of the manufacturing process, so that the risk of breakage of the window layer in the preceding steps is comparatively slight.

A process in which the window layer is first structured and provided with contact surfaces represents a second advantageous alternative. The semiconductor layer sequence is then applied. In this case, higher temperatures such as those necessary for sintering certain contact metallizations can be used to perform the contact metallization. These temperatures are usually so high that the semiconductor layer sequence would be damaged by them. Therefore, such damage is avoided by performing the contact metallization at the beginning of the manufacturing process.

In a third advantageous alternative manufacturing process, the structuring of the window layer takes place in two steps. To this end, the window layer is first prestructured to the extent necessary for developing the contact surfaces on the lateral faces. The contact surfaces are then developed, for example by vapor deposition. The semiconductor layer sequence is then applied to the window layer prestructured in this way and provided with contact surfaces. The window layer is then subjected to final structuring. This second structuring step is preferably combined with isolation of the components, for example by sawing the window layer with a shaped saw blade, and then breaking it apart. To minimize the risk of breaking the structured window layer, the window layer can also be mounted on a suitable auxiliary support.

Other features, benefits, and suitabilities of the invention will be explained below with reference to examples of embodiment in combination with FIGS. 1 to 16.

DESCRIPTION OF THE DRAWINGS

The figures show:

FIG. 1 a schematic cross sectional illustration of a first example of embodiment of a semiconductor component pursuant to the invention, FIG. 2 a schematic cross sectional illustration of a second example of embodiment of a semiconductor component pursuant to the invention, FIG. 3 a schematic cross sectional illustration of a third example of embodiment of a semiconductor component pursuant to the invention, FIG. 4 a schematic cross sectional illustration of a fourth example of embodiment of a semiconductor component pursuant to the invention, FIG. 5 a schematic cross sectional illustration of a fifth example of embodiment of a semiconductor component pursuant to the invention, FIG. 6 a schematic cross sectional illustration of a sixth example of embodiment of a semiconductor component pursuant to the invention, FIG. 7 a schematic cross sectional illustration of a seventh example of embodiment of a semiconductor component pursuant to the invention, FIG. 8 a schematic cross sectional illustration of an eighth example of embodiment of a semiconductor component pursuant to the invention, FIG. 9 a schematic cross sectional illustration of a ninth example of embodiment of a semiconductor component pursuant to the invention, FIG. 10 a schematic cross sectional illustration of a tenth example of embodiment of a semiconductor component pursuant to the invention, FIG. 11 a schematic cross sectional illustration of an eleventh example of embodiment of a semiconductor component pursuant to the invention, FIG. 12 a schematic perspective illustration of a twelfth example of embodiment of a semiconductor component pursuant to the invention, FIG. 13 a schematic illustration of a thirteenth example of embodiment of a semiconductor component pursuant to the invention, FIG. 14 a schematic illustration of a first example of embodiment of a manufacturing process pursuant to the invention in five intermediate steps, FIG. 15 a schematic illustration of a second example of embodiment of a manufacturing process pursuant to the invention in six intermediate steps, FIG. 16 a device for implementing an intermediate step in the examples of embodiment of a manufacturing process pursuant to the invention, and FIG. 17 a schematic illustration of a radiation-emitting semiconductor component pursuant to the priority-determining Patent Application DE 100 067 38.7.

DETAILED DESCRIPTION

Figure 10:
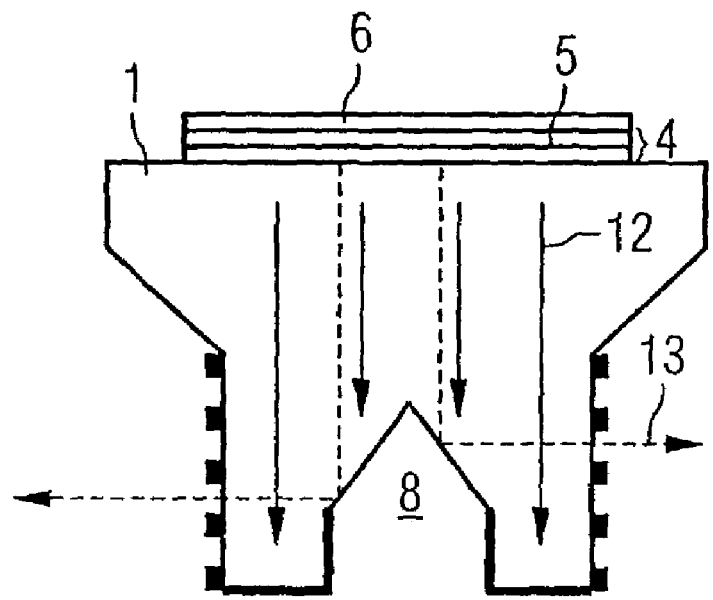

The example of embodiment shown in FIG. 1 has a window 1 with a first principal face 2 and a second principal face 3. A multilayered structure 4 with an active layer 5 that emits radiation during operation is applied to the first principal face 2 and is coated with a contact metallization 6.

The window 1 itself is formed from a cuboid base form 7 rectangular in cross section that has recesses 8 on its circumference. The window flanks 10 thus produced also correspond to the lateral faces of the recess and have a first subregion 10a that is arranged at an angle to the principal faces 2, 3 of the window and that changes into a second subregion 10b orthogonal to the principal faces at a greater distance from the multilayered structure 4.

In this second subregion 10b, the window flanks are provided with reflective contact metallization 11 that also covers the second principal face 3 of the window 1. The current paths 12 from the active layer to the contact surface 11 are shortened on the average by the contact surface 11 raised on the window flank 10b, and thus the series resistance of the component is advantageously lowered. The radiation is preferably output in the inclined region 10a of the window flanks.

In the example of embodiment shown in FIG. 2 the contact metallization 11 extends over the inclined subregions 10a of the window flanks. This achieves a further shortening of the current paths 12 and thus a reduction of series resistance. Of course the subregions 10a are then no longer available for direct radiation output. In this example of embodiment, therefore, the contact metallization 11 is made reflective so that the fractions of radiation emitted into the window for the most part are again reflected toward the multilayered structure 4 and are subsequently output. This is made clear by way of example by the beams 13a and 13b. Alternatively, the corresponding contact surfaces can also be perforated.

In the third example of embodiment shown in FIG. 3, in contrast to the examples of embodiment described above, the recess 8 runs through the center of the second principal face 3 as a central indentation. The contact metallization 11 is developed over the entire area over the second principal face 3 and the lateral faces of the indentation 8. The current path 12 to the active layer is shortened in this way within the indentation 8, and the series resistance of the component is reduced. The contact metallization can again be made reflective to increase the radiation yield.

FIG. 4 shows a fourth example of embodiment, in which the envelope of the first example of embodiment is advantageously combined with the central indentation of the third example of embodiment. In this way the series resistance is advantageously lowered by the shortening of the current path 12 as in the third example of embodiment, with the window flank being available at the same time for output of radiation. In addition, because of the central indentation 8 with reflective contact metallization 11, the radiation yield is increased by the radiation fractions 13 reflected out laterally.

In the firth example of embodiment shown in FIG. 5, the contact metallization 11 extends both across the central indentation 8 in the second principal face of the window 1 and across subregions of the window flanks 10. Compared to the fourth example of embodiment, the series resistance is lowered further in this way, with this entailing a reduced radiation yield in the area of the contact metallization. Depending on how the parameters of series resistance and radiation yield are weighted, the fourth or the fifth example of embodiment may be more advantageous, with the transition between these two examples of embodiment being continuous depending on the extent of the contact metallization on the window flanks.

The radiation yield can be increased by reflection at the central indentation 8 in the second principal face 3 in various ways. One possibility has already been shown in the context of the fourth example of embodiment in FIG. 4, beam 13c. If the angle of opening of the central indentation 8 is enlarged, the result is to increase reflection toward the multilayered structure 4 and thus output through the multilayered structure 4.

This is illustrated in the sixth example of embodiment in FIG. 6 with reference to the beam 13d. Aside from the central indentation 8, this example of embodiment corresponds to the fourth example of embodiment, FIG. 4. The central indentation 8, on the other hand, is cut distinctly deeper than in FIG. 4 and has a five-cornered cross section, which is composed of a rectangle with added triangle. The angle of opening of the triangle is greater than shown in the example of embodiment illustrated in FIG. 4 and causes increased reflection toward the multilayered structure 4. It is advantageous in this case to perforate the contact surface 6 on the multilayered structure and thus enlarge the output through this contact surface.

The deeply cut and completely metallized recess 8 also leads to an especially great shortening of the current path 12 because of the closeness of the bottom face of the recess to the multilayered structure 4.

In the seventh example of embodiment illustrated in FIG. 7, in contrast to the sixth example of embodiment, the angle of opening of the central recess is chosen to be smaller. This leads to increased reflection toward the inclined lateral window face sections 10a, and in connection with this to increased output on the part of the multilayered structure 4. It is also advantageous here to perforate the contact surface 6 on the multilayered structure 4. Various beam paths are shown schematically by the beams 13.

In the eighth example of embodiment shown in FIG. 8, in contrast to the prior examples of embodiment, only the second principal face 3 and the multilayered structure 4 are provided with contact surfaces, with the contact surface 6 on the multilayered structure being perforated. This achieves particularly high radiation output through the lateral faces 10. The central indentation 8 is designed so that total reflection occurs on a portion of its lateral faces.

In the examples of embodiment shown in FIGS. 9 and 10, the lateral faces of the window are partially provided with perforated contact surfaces. With these, radiation output is also advantageously possible in the area of these contact surfaces, with series resistance being beneficially reduced by the reduction of the distance between the contact surfaces 6 and 11. In the example of embodiment shown in FIG. 9, the contact surface also extends over the central recess 8. In the example of embodiment according to FIG. 10, on the other hand, the central recess is uncoated, to reduce manufacturing costs, and the radiation 13 is totally reflected on the inside of the central recess 8.

Figure 11:
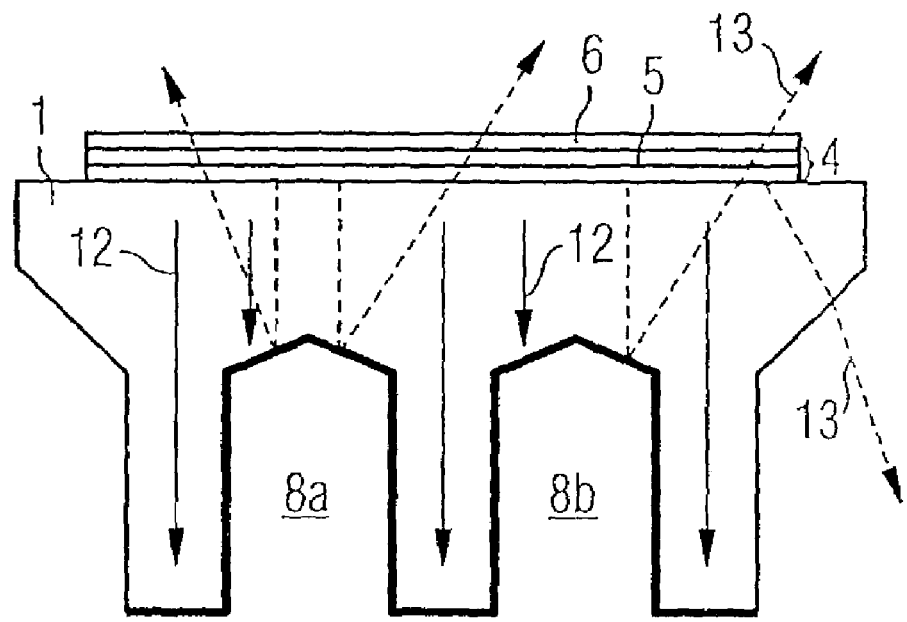

FIG. 11 illustrates another example of embodiment, which in contrast to the previously described examples of embodiment has two central recesses 8a, b. The recesses 8a, b and the contact metallization 11 on them correspond in shape to the sixth example of embodiment; naturally combination with the other shown examples of embodiment is likewise possible. The multiple arrangement of recesses in the second principal face 3 is advantageous especially for large-area semiconductor components, since both the series resistance of the component can be lowered and the radiation yield over the entire component can be increased with a plurality of recesses. Of course more than the two recesses 8a, b can also be made if the stability of the component permits.

In the examples of embodiment, the window 1 preferably consists of silicon carbide onto which a gallium nitride-based multilayered structure is applied. Silicon carbide is preferably used as the epitaxy substrate for gallium nitrite-based [sic] semiconductor elements. Gallium nitride-based materials here, besides GaN itself, means materials derived from or related to GaN, in particular ternary or quaternary mixed crystal systems such as AlGaN ($Al_{1-x}Ga_xN$, $0 \leq x \leq 1$), InGaN ($In_{1-x}Ga_xN$, $0 \leq x \leq 1$), InAlN ($In_{1-x}Al_xN$, $0 \leq x \leq 1$), and AlInGaN ($Al_{1-x-y}In_xGa_yN$, $0 \leq x \leq 1$, $0 \leq y \leq 1$).

The epitaxial production of such gallium nitride-based components requires a substrate largely matching the gallium nitride lattice, for which silicon carbide is especially suitable.

Of course silicon carbide has a very high index of refraction of about 2.7, so that the total reflection losses are correspondingly high and the degree of output is correspondingly low. The shown examples of embodiment advantageously increase the radiation yield, especially because of the inclined lateral faces. The series resistance of the component, increased in principle by the reduced cross section of the window, is compensated for, or furthermore even lowered, by the laterally raised contact surfaces. Providing reflective, semi-transparent or perforated contact metallizations contributes to further increasing the radiation yield.

However, the invention is not limited to gallium nitride-based systems, but can also be used with other semiconductor systems, for example such as materials based on gallium arsenide, gallium phosphide, or zinc selenide. Here also, a substantial fraction of the radiation generated remains in the multilayered structure-window arrangement because of total reflection and is ultimately absorbed.

The invention is also beneficial for window materials other than those mentioned so far, for example materials based on quartz glass, diamond, ITO (indium tin oxide), or on zinc oxide, tin oxide, indium oxide, or gallium phosphide, since as a rule with all of these windows there is a transition to an optically thinner medium by which total reflection can occur and the degree of output is accordingly reduced.

The invention is also advantageous for potted semiconductor bodies and windows or for those otherwise provided with a covering, since the covering as a rule has a lower index of refraction so that in this case also, the radiation yield is reduced by total reflection.

A window made of the materials mentioned can be applied to the multilayered structure after the multilayered structure is produced. In epitaxial production of the multilayered structure, this is possible, for example, by detaching the epitaxy substrate after the epitaxy and bonding the window to the multilayered structure in its place by a wafer-bonding process.

Alternatively, the window can also be applied to the epitaxially manufactured semiconductor surface and the epitaxy substrate then detached thereafter. This procedure has the advantage that the epitaxy substrate can be reused, which leads to a clear cost benefit especially in the case of expensive materials, for example silicon carbide substrates in this case.

FIG. 12 illustrates schematically a first example of embodiment of a manufacturing method with reference to five intermediate steps 12a to 12c [sic].

Figure 12A:
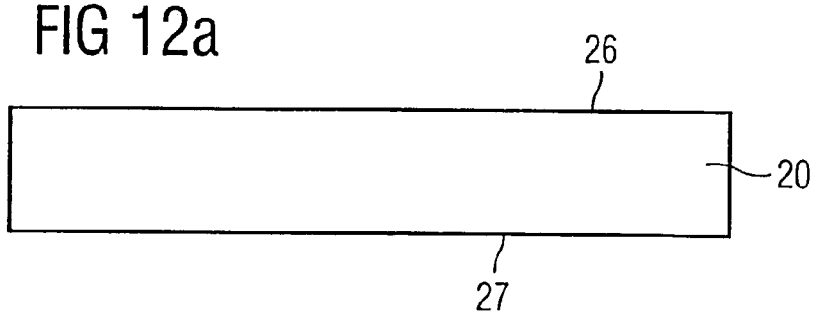

A window layer 20 from which the window 1 will later be made is first made ready, FIG. 12a. The window layer 20 can be in the form of a silicon carbide substrate, for example.

A semiconductor layer sequence 21 is applied to the window layer 20; in particular it contains an active semiconductor layer that generates radiation in operation. The semiconductor layer sequence 21 corresponds to the multilayered structure 4 of a semiconductor component pursuant to the invention. The sequence of layers is preferably grown epitaxially or applied by a wafer-bonding method. An epitaxy process advantageously reduces the number of manufacturing steps, since attachment to the window layer 20 already occurs with the epitaxial production of the semiconductor layer sequence 21. On the other hand, a wafer-bonding process has the advantage that materials unsuitable for epitaxy but otherwise beneficial can also be used for the window layer. In addition, the epitaxy substrate used in the manufacture of the semiconductor layer sequence can be reused, and the manufacturing costs can thus be reduced.

Figure 12B:
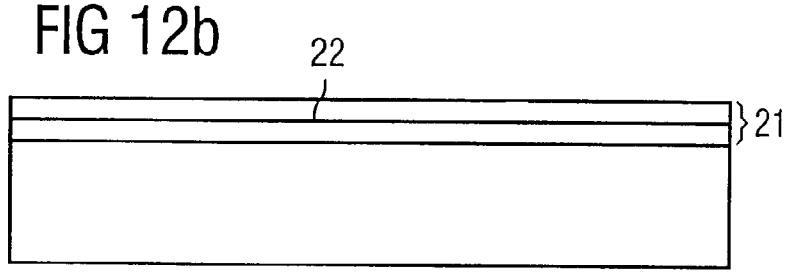
Figure 12C:
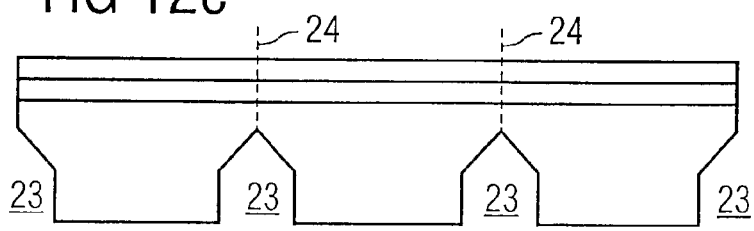
Figure 12D:
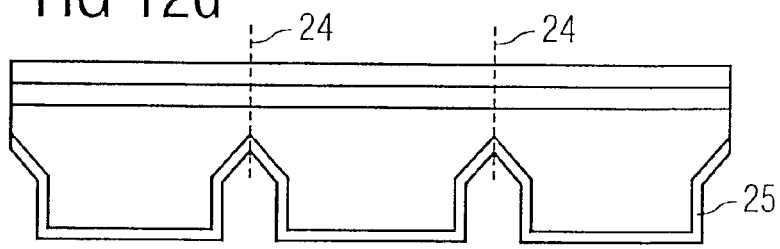
Figure 12E:
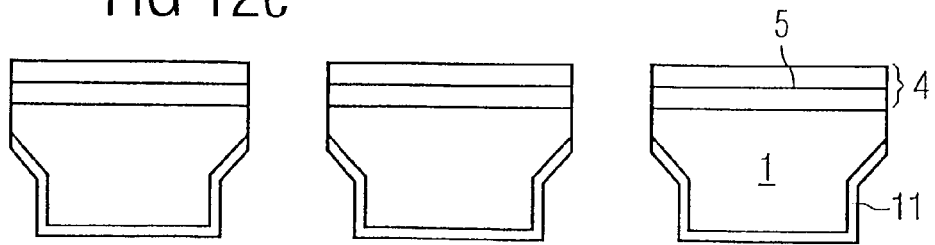

After attaching the semiconductor layer sequence 21, the window layer 20 is structured, FIG. 12b. In the example of embodiment shown, the window layer 12 for this purpose is sawed at the parting planes 24 intended for later singling. The saw blade has a shaped edge that is complementary in cross section in the sawing region to the recess 23 to be formed. To make a central indentation, as illustrated by way of example in the third example of embodiment, the sawing would have to occur only between the parting planes 24.

Overall metallization 25 is then performed on the structured window layer 20. This step will be explained in greater detail below.

The composite of semiconductor layer sequences 21 and window layer 20 is then divided into individual semiconductor components by breaking it at the parting planes 24, with the parts of the window layer 20 constituting the window 1 and the parts of the semiconductor layer sequence 21 applied thereto constituting the multilayered structure 4.

FIG. 13 shows a second example of embodiment of a manufacturing method pursuant to the invention. Again, the process begins with preparation of a window layer 20, FIG. 13a. The window layer 20 has a first principal face 26 that is intended for the attachment of a semiconductor layer sequence. Structuring is carried out on the second principal face 27 of the window layer.

Figure 13A:
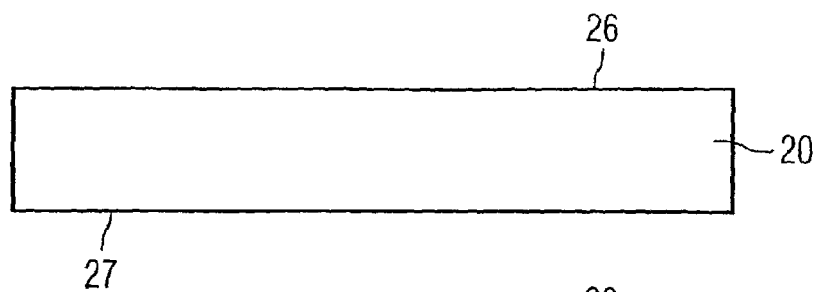
Figure 13B:
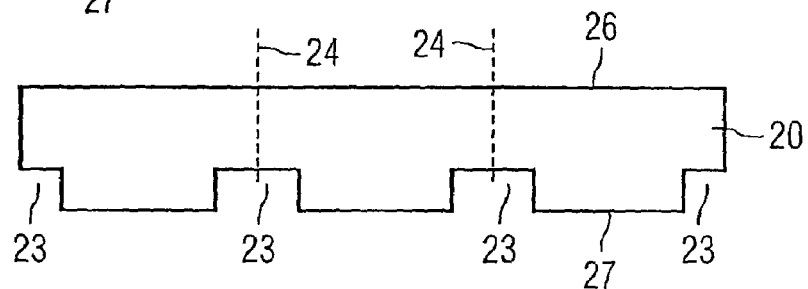
Figure 13C:
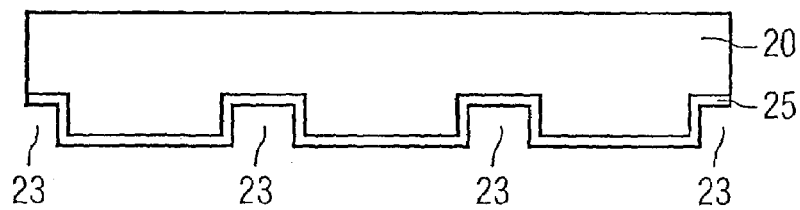
Figure 13D:
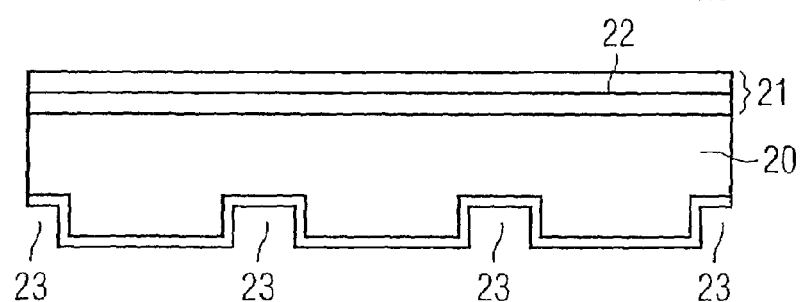
Figure 13E:
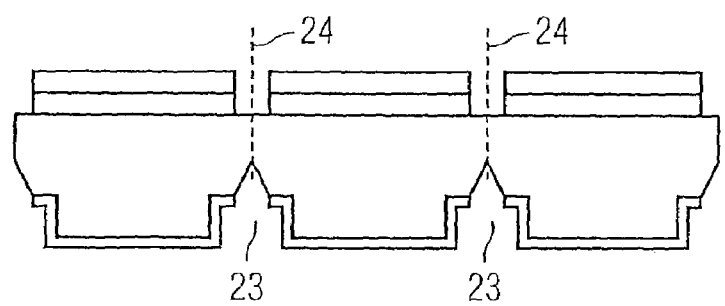

The window layer 20 is then prestructured before attaching the semiconductor layer sequence 21, FIG. 13b. For this purpose the window layer 20 is sawed into on the second principal face 27 at the intended parting planes 24, so that a plurality of recesses 23 is produced, for example with rectangular cross sections. The depth of sawing and the depth of the recesses 23 are chosen so that the lateral faces to be provided with a contact surface are just exposed. A more extensive, deeper structuring takes place only in a later step of the manufacturing process, so that the mechanical stability of the window layer is largely retained initially.

The recesses 23 formed in this way and the remaining areas of the second principal face 27 are then provided with continuous contact metallization 25. Since there are still no semiconductor layers on the window layer 20, the contact metallization 25 can preferably be developed at substantially higher temperatures than in the previous example of embodiment. This simplifies or permits sintering of the contact metallization, for example, which likewise advantageously lowers the series resistance of the component.

In the next step, as in the example of embodiment described previously, a semiconductor layer sequence 21 that contains an active layer 24 is applied to the first principal face 26 of the window layer 20. Since the contact metallization 25 has already been formed, sensitive semiconductor structures in particular can also be formed, for example multiple quantum well structures with low structural thicknesses, which degrade easily at higher temperatures.

This is followed by another structuring step in which the structuring of the window layer 20 already begun is completed. The recesses 23 already formed are deepened and further shaped by sawing again, for example by forming inclined flanks in the window layer to increase radiation output. In addition, the semiconductor layer sequence 21 is also divided into individual multilayered structures 4. An etching method using a known masking technique, for example, is suitable for the structuring of the semiconductor layer sequence 21.

Figure 13F:
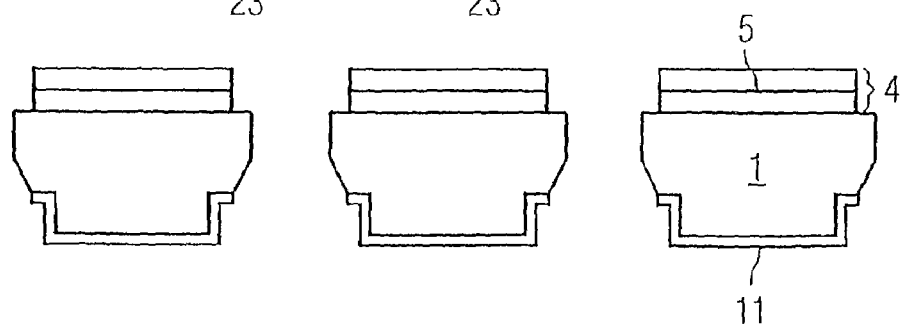

In the last step, FIG. 13f, the composite of window layers and multilayered structure is singled, as in the preceding example of embodiment.

Figure 14:
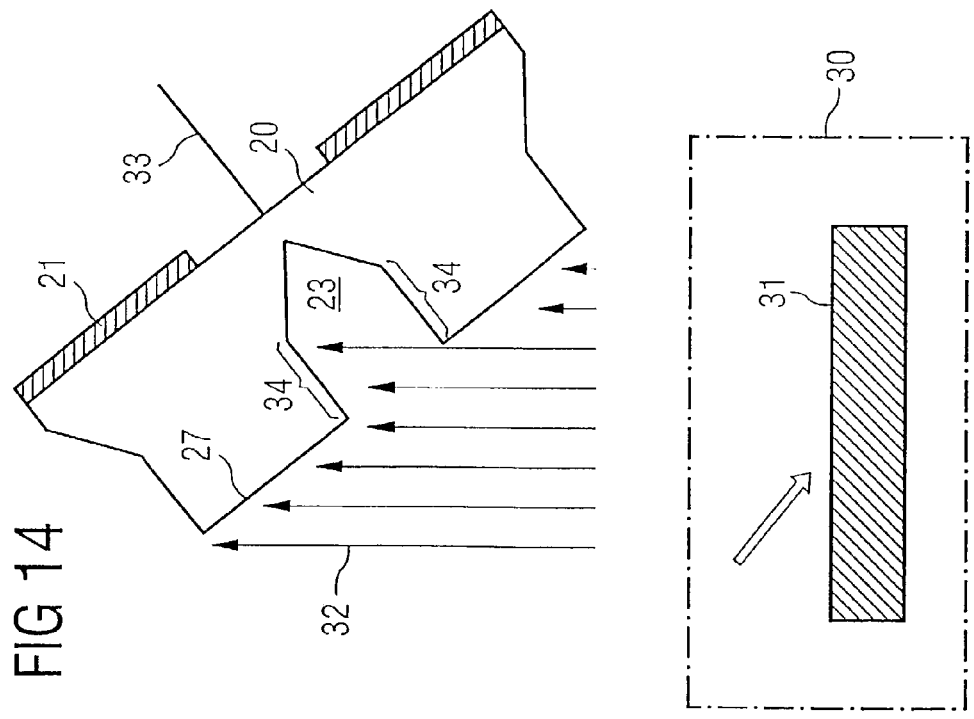

In the described manufacturing method it is necessary to provide structured surfaces, for example the surface 27 and the recesses 23 formed in it in FIG. 12, with a uniform contact surface. These structured surfaces are composed of a plurality of individual surfaces joined at an angle, which makes it difficult to develop a contact surface. A suitable device for applying contact metallization is shown in FIG. 14. The device contains a source of metal vapor 30 from which the metal vapor 32 escapes in a preferential direction. An electron beam vaporizer with a target and an electron beam aimed at this target can be used as the source of metal vapor 30, for example.

The surface of a window layer 20 to be vapor-metallized is turned toward the vapor source 30, with the surface to be metallized being arranged at an angle to the preferential direction of the source of metal vapor 32. The metal vapor 32 therefore is deposited on both the principal face 27 and the insides of the recesses 23. The metallized region within the recesses is determined essentially by shadows of projecting edges. The depth to which the metal layer is developed inside the recesses 23 varies with the slope of the surface to be metallized relative to the preferential direction of the metallization source.

Figure 15:
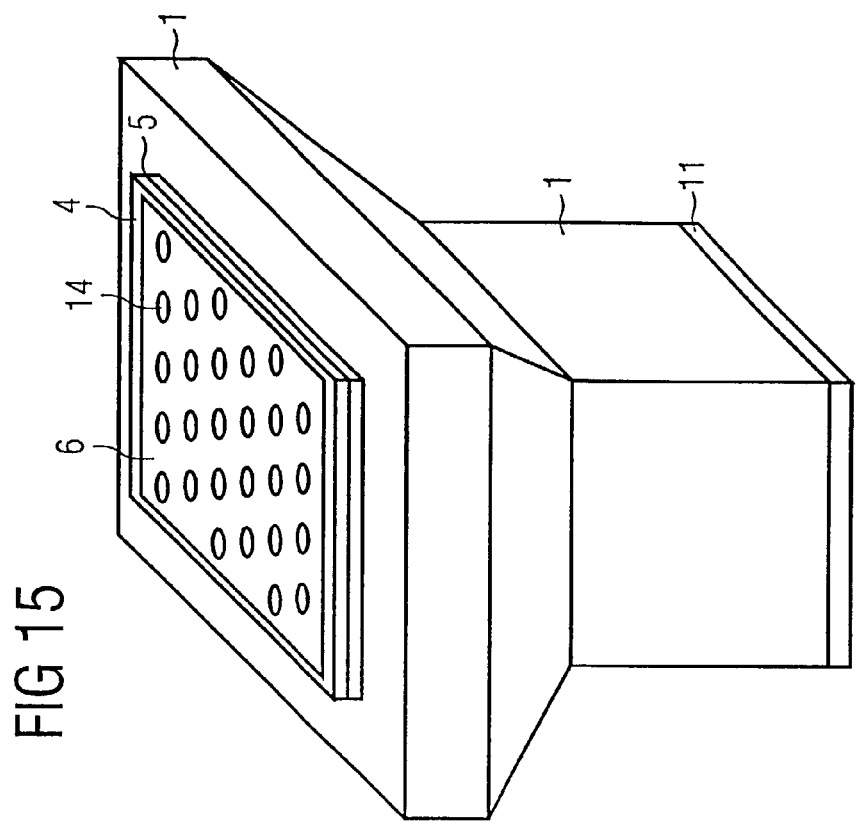

FIG. 15 shows in perspective another example of embodiment of the invention, with the window having flanks with an inclined region 10a to increase radiation output. The multilayered structure 4 is also provided with a perforated contact surface 6 that has a plurality of circular openings 14. The contact surface itself can be a thick, reflective platinum or palladium contact layer, for example, with the preferred thickness being between 10 nm and 30 nm.

Alternatively, the contact layer 6 can also be of thin form, so that the contact layer 6 is transparent to radiation. The radiation generated is then beneficially output through the openings 14 as well as through the contact layer also.

Figure 16A:
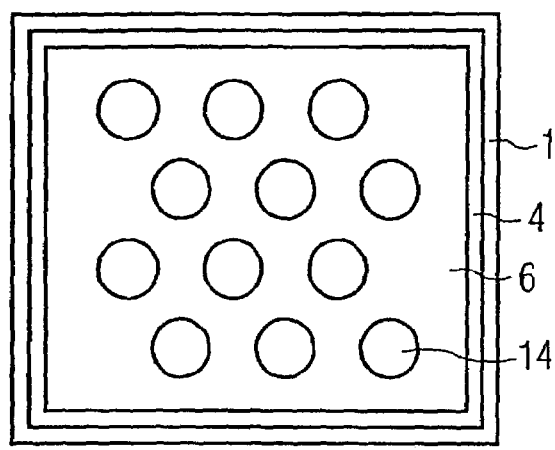
Figure 16B:
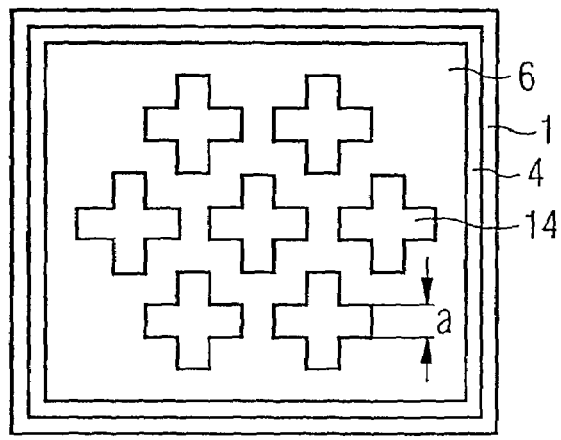
Figure 17:
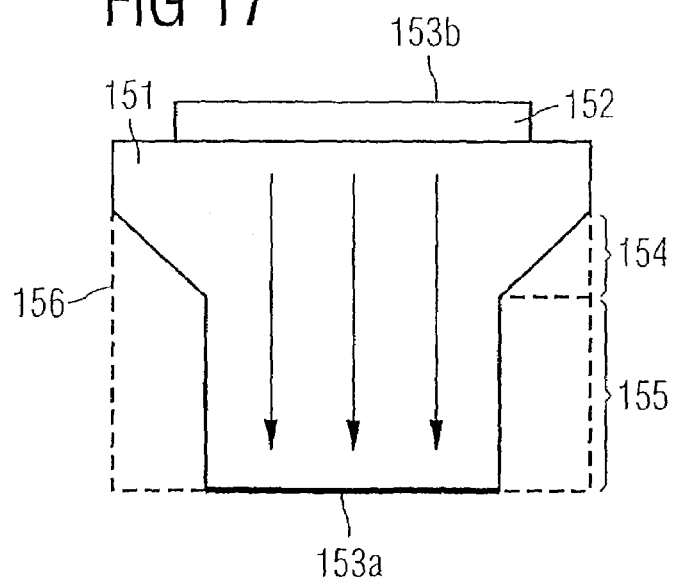

FIG. 16 shows two plan views of an example of embodiment of the invention with perforated contact surface. In the example of embodiment illustrated in FIG. 16a, the openings in the contact layer 6 are circular in shape. Alternatively, the openings can also be formed of crossed slits, for example, as shown in FIG. 16b. It is preferred for the openings to be tightly packed. So that the intermediate regions of the contact surface do not become too narrow and thus impair conduction of current into the component, the crossed-slit openings in FIG. 16b are arranged so that their mutual separation is no smaller than the arm width a.

The diameter or arm width a of the openings 14 is advantageously of such a dimension that current propagation produces a largely homogeneous current density in the active layer.

The explanation of the invention with reference to the shown examples of embodiment naturally does not represent any limitation of the invention to these examples of embodiment.

The invention claimed is:

1. Radiation-emitting semiconductor component with a multilayered structure that contains a radiation-emitting active layer, and a window transparent to radiation that has a first principal face and a second principal face opposite the first principal face, and whose first principal face adjoins the multilayered structure, with the window having at least one recess to form radiation-output surfaces running at an acute angle to the first principal face, wherein at least one of the window and the recess has a lateral face adjoining the second principal face that is provided, at least in part, with a contact layer having a first contact surface reflective to radiation emitted by the radiation-emitting active layer.

2. Radiation-emitting semiconductor component pursuant to claim 1,
characterized by the fact that the first contact surface also at least partially covers the second principal face of the window.

3. Radiation-emitting semiconductor component pursuant to claim 1, characterized by the fact that a second contact surface is produced on the multilayered structure.

4. Radiation-emitting semiconductor component pursuant to claim 1, characterized by the fact that the recess is made in the form of an indentation in the second principal face.

5. Radiation-emitting semiconductor component pursuant to claim 4, characterized by the fact that the indentation has a triangular, trapezoidal, or semicircular cross section.

6. Radiation-emitting semiconductor component pursuant to claim 4, characterized by the fact that the indentation is made in the form of a trough with triangular, trapezoidal, or semicircular cross section.

7. Radiation-emitting semiconductor component pursuant to claim 1, characterized by the fact that the recess is made near the edge so that the window is tapered down toward the second principal face.

8. Radiation-emitting semiconductor component pursuant to claim 1, wherein the contact layer comprises platinum, palladium, silver, gold, nickel, or an alloy of these metals.

9. Radiation-emitting semiconductor component pursuant to claim 1, wherein the contact layer comprises a thickness between 5 nm and 200 nm, preferably between 10 nm and 100 nm.

10. Radiation-emitting semiconductor component pursuant to the claim 1, characterized by the fact that the window is manufactured from the epitaxy substrate used for the epitaxial growth of the multilayered structure.

11. Radiation-emitting semiconductor component pursuant to claim 1, characterized by the fact that the refractive index of the material of the window is greater than the refractive index of the material of the multilayered structure, especially of the active layer.

12. Radiation-emitting semiconductor component pursuant to claim 1, characterized by the fact that the window contains sapphire, quartz glass, diamond, ITO, tin oxide, zinc oxide, indium oxide, silicon carbide, or gallium phosphide.

13. Radiation-emitting semiconductor component pursuant to claim 1, characterized by the fact that the multilayered sequence is made from nitride-based semiconductor materials.

14. Radiation-emitting semiconductor component pursuant to claim 1, characterized by the fact that the multilayered structure is made on gallium nitride-based semiconductor materials and preferably contains at least one of the compounds $Al_{1-x}Ga_xN$, $0 \leq x \leq 1$, $In_{1-x}Ga_xN$, $0 \leq x \leq 1$, $In_{1-x}Al_xN$, $0 \leq x \leq 1$, and $Al_{1-x-y}In_xGa_yN$, $0 \leq x \leq 1$, $0 \leq y \leq 1$.

15. Radiation-emitting semiconductor component pursuant to claim 1, characterized by the fact that the window consists of silicon carbide or is based on silicon carbide, and the multilayered sequence is made from nitride-based semiconductor materials.

16. The component of claim 1, wherein the contact layer defines a current path through the window to the multilayered structure.

17. The component of claim 1, wherein the radiation output surfaces are configured to output radiation from the radiation-emitting output component.

18. The component of claim 17, wherein the contact layer defines a current path through the window to the multilayered structure.

19. Radiation-emitting semiconductor component with a multilayered structure that contains a radiation-emitting active layer, and a window transparent to radiation that has a first principal face and a second principal face opposite the first principal face, and whose first principal face adjoins the multilayered structure, with the window having at least one recess to form radiation-output surfaces running at an angle to the first principal face wherein at least one of the window and the recess has a lateral face adjoining the second principal face that is provided, at least in part, with a contact layer having a first contact surface characterized by the fact that the recess has at least one lateral surface that contains a first lateral surface section inclined with respect to the first principal face of the window, which is continued into a second lateral surface section perpendicular to the first principal face of the window.

20. Semiconductor component pursuant to claim 19, characterized by the fact that all of the lateral surfaces of the recess have a first lateral surface section and a second lateral surface section.

21. Semiconductor component pursuant to claim 19, characterized by the fact that the first lateral surface section is a planar inclined surface that makes an angle with the normal to the multilayered structure that is between 20° and 30° inclusive.

22. Semiconductor component pursuant to claim 19, characterized by the fact that at least the first lateral wall section is roughened.

23. Radiation-emitting semiconductor component with a multilayered structure that contains a radiation-emitting active layer, and a window transparent to radiation that has a first principal face and a second principal face opposite the first principal face, and whose first principal face adjoins the multilayered structure, with the window having at least one recess to form radiation-output surfaces running at an acute angle to the first principal face, wherein at least one of the window and the recess has a lateral face adjoining the second principal face that is provided, at least in part, with a first contact layer defining a first contact surface, the component having a second contact layer defining a second contact surface closer to the radiation-emitting active layer than the first contact surface and transparent to radiation emitted by the radiation-emitting active layer.

24. The component of claim 23, wherein the first contact layer defines a current path through the window to the multilayered structure.

25. The component of claim 23, wherein the radiation output surfaces are configured to output radiation from the radiation-emitting output component.

26. The component of claim 25, wherein the first contact layer defines a current path through the window to the multilayered structure.

27. The component of claim 23, wherein the second contact layer is formed on the multilayered structure.

28. A radiation-emitting semiconductor component comprising:

a multilayered structure that contains a radiation-emitting active layer;

a window transparent to radiation emitted by the radiation-emitting active layer, the window comprising a top face adjoining the multilayered structure and a bottom face opposite the top face, the window further comprises a side face defining an acute angle with the top face, wherein at least a portion of the side face forms a radiation output surface for the radiation-emitting semiconductor component; and a contact layer formed on the window to define a current path through the window between the multilayered structure and the contact layer, wherein the contact layer is further formed on at least another portion of the side face and is reflective to the radiation emitted by the active layer.

29. The component of claim 28, wherein the contact layer is formed on at least a portion of the bottom face of the window.

* * * * *

UNITED STATES PATENT AND TRADEMARK OFFICE
CERTIFICATE OF CORRECTION

PATENT NO. : 7,205,578 B2  Page 1 of 1
APPLICATION NO. : 10/203728
DATED : April 17, 2007
INVENTOR(S) : Dominik Eisert et al.

It is certified that error appears in the above-identified patent and that said Letters Patent is hereby corrected as shown below:

Title Page;
Page 2, Foreign Patent Documents, correct the following references:

Replace "EP  JP  59-004088 1/1982" with --JP  59-004088  1/1982--
Replace "EP  JP  61-110476 5/1986" with --JP  61-110476  5/1986--
Replace "EP  JP  61-296780 12/1986" with --JP  61-296780  12/1986--
Replace "EP  JP  03-227078 10/1991" with --JP  03-227078  10/1991--
Replace "EP  JP  03-283675 12/1991" with --JP  03-283675  12/1991--
Replace "EP  JP  05-327012 12/1993" with --JP  05-327012  12/1993--
Replace "EP  JP  06-310752 11/1994" with --JP  06-310752  11/1994--
Replace "EP  JP  07-086635 3/1995" with --JP  07-086635  3/1995--
Replace "EP  JP  08-102549 4/1996" with --JP  08-102549  4/1996--
Replace "EP  JP  10-256602 9/1998" with --JP  10-256602  9/1998--
Replace "JP  094137771 5/1992" with --JP  04-137771  5/1992--

Signed and Sealed this

Twenty-third Day of October, 2007

JON W. DUDAS
*Director of the United States Patent and Trademark Office*